United States Patent

McCoy et al.

[15] 3,673,427

[45] June 27, 1972

[54] INPUT CIRCUIT STRUCTURE FOR MOS INTEGRATED CIRCUITS

[72] Inventors: Michael R. McCoy; Glen E. Nixon, both of San Jose, Calif.

[73] Assignee: Electronic Arrays, Inc., Mountain View, Calif.

[22] Filed: Feb. 2, 1970

[21] Appl. No.: 7,768

[52] U.S. Cl. ..........................307/202, 307/304, 317/234 N, 317/235 B, 317/235 G, 317/235 T

[51] Int. Cl. ..........................H01l 19/00

[58] Field of Search ................307/304, 202; 317/235, 22.2, 317/30

[56] References Cited

UNITED STATES PATENTS

| | | | |
|---|---|---|---|
| 3,512,058 | 5/1970 | Khajezadeh et al | 317/235 |
| 3,449,648 | 6/1969 | Beale et al. | 317/235 |
| 3,395,290 | 7/1968 | Farina et al. | 307/202 |
| 3,423,606 | 1/1969 | Wanlass | 307/302 |
| 3,601,625 | 8/1971 | Redwine et al. | 307/202 |

FOREIGN PATENTS OR APPLICATIONS

| | | | |
|---|---|---|---|
| 6,802,684 | 8/1968 | Netherlands | 317/235 G |

OTHER PUBLICATIONS

Richman, " Characteristics of MOSFET" McGraw-Hill (1967) pp. 77-79.

*Primary Examiner*—John W. Huckert
*Assistant Examiner*—William D. Larkin
*Attorney*—Smyth, Roston & Pavitt

[57] ABSTRACT

An MOS integrated circuit has input circuit bonding pads individually used as gate in a protective transistor, having channel width larger than the linear dimensions of a pad, and having turn-on voltage above normal input signal levels. The transistor switches into the circuit attenuating resistance, and a zener diode is shunted parallel to the input signal path in the interior of the IC-chip.

6 Claims, 4 Drawing Figures

Figures 1, 2, 3, 4:
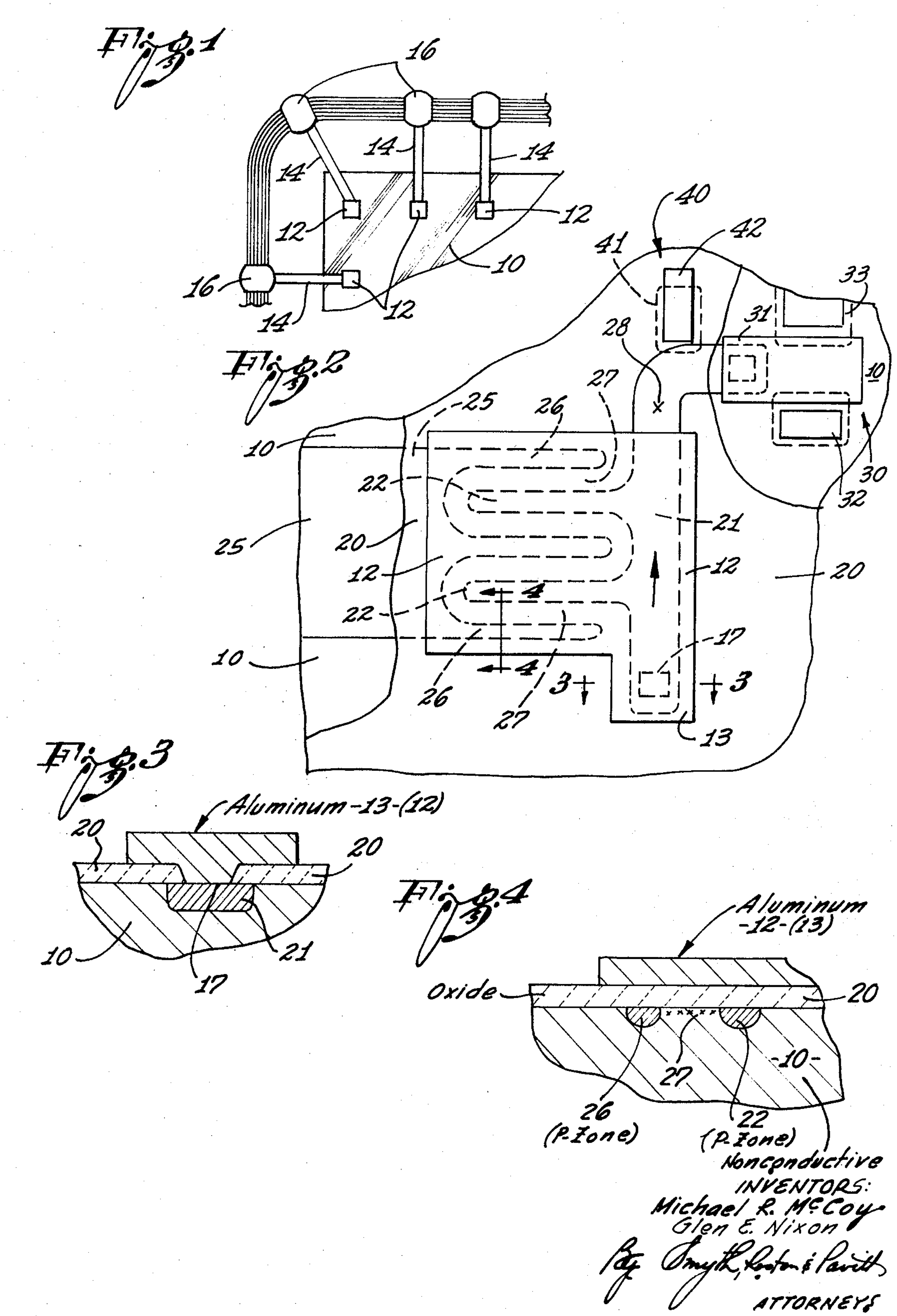

INVENTORS:
Michael R. McCoy
Glen E. Nixon
By Smyth, Roston & Pavitt
ATTORNEYS

INPUT CIRCUIT STRUCTURE FOR MOS INTEGRATED CIRCUITS

The present invention relates to a protective circuit for MOS field effect devices as they are included in integrated circuit chips and more particularly to input circuit structure for an MOS field effect, integrated circuit device. It has been suggested generally to include a protective MOS transistor in an integrated circuit chip which protective transistor has its gate and drain electrodes connected to the input signal source. The voltage of the input signal may exceed the limit or come dangerously close to the limit producing actual breakthrough of the thin oxide layer in a regular device MOS transistor in the IC-chip receiving that signal in its gate. The protective transistor is interposed and has its gate insulated by a thicker oxide layer than used for the regular, operating transistors of the circuit. This protective transistor is nonconductive for normal operating voltages but becomes conductive for excess voltages. The source of the protective transistor is connected to ground so that the input signal is bled off to ground. The present invention relates to further improvements of protective structure for an MOS-integrated circuit device.

In accordance with the present invention it is suggested to use the bonding pad through which external signals are coupled to the MOS integrated circuit device and which has a relatively large area as compared with electrode areas within the integrated circuit chip, as a gate electrode in a protective transistor. A relatively small portion of the gate-bonding pad is ohmically connected to a first conductive zone within the integrated circuit chip, underneath the bonding pad, but separated from the main portion thereof by a relatively thick portion of the insulating layer. A second particularly conductive zone of the same type of conductivity is juxtaposed to that first mentioned zone, in interleaved configuration therewith and also underneath the bonding pad for establishing a channel between the two zones. The second zone is connected to the same source of potential to which the substrate is connected, usually ground. Hence, the first zone is the drain and the second zone is the source for this transistor. The first, drain electrode zone then is a zone establishing distributed resistance in a path that leads to the gate electrode of an operating transistor, within the IC-chip, and either directly or through other transistors, with a zener diode in a shunt path to the substrate.

When compared with dimensions of regular transistors in an MOS-IC device, the bonding pad covers an area of considerable proportions. A bonding pad is usually rectangular having dimensions considerably larger (by at least one order of magnitude) than channel dimensions of regular field effect transistors. Therefore, the drain and source zones of the protective transistor extend underneath the bonding pad at a contour defining a meandering channel between them. The length of the meandering curve is considerable and defines the width of the channel as well as the cross section of the current path therethrough. The width of the channel is to be considerably larger than any linear dimension (length, width) of the bonding pad.

As that cross section is thus made larger by one or several orders of magnitude than, the channel cross section of regular minimum size MOS transistors, considerable current can flow through that channel but at current densities normal for regular MOS-transistors. The two zones in the protective transistor are disposed as close to each other as possible, to define minimum length dimensions for the channel, so that there is steep onset of conduction and current flow when the gate-bonding pad potential exceeds threshold response of the device.

As an external voltage signal is applied to the bonding pad, below the threshold and turn-on level for the protective transistor but above the turn-on voltage level for any of the operating transistors of the integrated circuit chip, the signal bypasses the protective transistor underneath the bonding pad, and is applied through an extension of zone, for example, to the gate electrode of the first operating transistor connected to it. The bonding pad protective transistor, however, is rendered conductive when the voltage applied to the bonding pad exceeds the turn-on voltage for that transistor. As there is now a current bypass to ground, the voltage of the first zone is limited to a safe level, additional clamping being provided by the zener diode. This stepwise clamping operation is possible because, as stated above, the protective transistor, when conductive, permits a large current to flow by passing completely any operating transistor and producing a voltage drop in the diffused resistive portion of the one zone, to attenuate an excessive input signal.

While in specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 illustrates a top view of a portion of an integrated circuit chip with bonding pad and current lead-ins improved in accordance with the present invention;

FIG. 2 illustrates a top view of a bonding pad, on considerably enlarged scale and showing the various salient zones and regions establishing the bonding pad transistor in accordance with the present invention; and FIG. 3 and 4 illustrate section views along lines 3—3 and 4—4 respectively in FIG. 2.

Proceeding now to the detailed description of the drawings, in FIG. 1 thereof there is shown somewhat schematically a top view of an integrated circuit chip structure which for the present case is presumed to be of the MOS type but which has certain aspects that are common to all integrated circuits. The chip itself is denoted with reference numeral 10 and is comprised of a semiconductor wafer provided with suitable etchings, specifically doped regions etc. to establish an integrated circuit.

As is known, the wafer 10 is quite small and special means are needed in order to provide signals to the wafer 10 or to extract useful signals from the circuit included in chip 10. For this there are provided so-called bonding pads, such as the pads 12, in FIG. 1. These pads are still quite small but comparatively large as far as the dimensions of individual circuit components within the chip 10 is concerned.

These bonding pads are metallic layers which have been deposited onto the wafer 10 and make intimate (ohmic) contact with certain particularly doped regions from which extend signal paths to further components, regions, electrode layers, pertaining to transistors etc. included in the circuit of chip 10 for signal processing therein or for signal derivation therefrom.

The bonding pads, such as bonding pad 12, now serve as conductor to which are soldered thin wires such as 14, and these wires physically fan out from the chip and terminate, for example, in solder points 16 on a frame 15. The solder points are established to provide for further connection to other wires, which, in turn, permit physical connection of that IC system to socket pins for further connection to suitable wires and lines, for example, on an printed circuit board.

This being the background and environment in which the invention is employed, it is emphasized that in the past the existence of these bonding pads did not serve any purpose other than to provide, on one hand, an interface for ohmic contact with a particularly heavily doped region within the integrated circuit chip for transmission of signals to or from the interior of the integrated circuit chip, while on the other hand, that bonding pad offered a sufficiently large surface area permitting soldering to a wire which permitted conventional wiring to circuits external to the integrated circuit chip. The size of the bonding pad was dictated by the requirements for wire bonding. As far as the integrated circuit is concerned, that pad appears to be excessively large, "wasting" space on the IC-chip.

Turning now to FIG. 2 there is illustrated such a bonding pad 12 in a considerably enlarged scale and in top view. As can be seen from the sections in FIGS. 3 and 4 this bonding pad 12 is a metallic layer which is deposited directly on the oxide, i.e., on the dielectric layer 20 which covers essentially one entire surface of the chip except for certain apertures through which ohmic contact is made between electrode layers and particularly doped regions in the chip. In the specific example, and as can be seen specifically from FIG. 3, there is such an aperture in oxide layer 20 but being quite small in comparison with the dimensions of the bonding pad. This aperture is located particularly underneath a lug-like extension 13 of bonding pad 12. The bonding pad, through its lug 13, makes ohmic contact through that aperture with a particularly doped diffusion region 21 at 17.

Assuming the MOS structure is designed for P channel type operation, integrated circuit chip 10 is comprised essentially of an N type substrate, i.e., there is a silicon wafer doped to assume N type conductivity; the particular region 21 (and others) has been doped to become P type conductive. Its interface 17 with bonding pad 13 makes ohmic contact so that in effect a particular signal voltage as applied from and by external circuitry to the bonding pad is essentially directly applied to P region or zone 21, without significant attenuation.

Zone 21 extends beyond that portion of the semiconductor body 10 covered by the bonding pad (see point 28) and may make contact and terminate at a gate 31 of a signal input transistor 30. That gate is established by a metallic layer increment and covering a channel as it extends between a P zone 32 and a second P zone 33 respectively, establishing drain and source electrodes of this operating transistor 30. Zones 32 and 33 connect to other circuit elements within the IC-chip.

Between zone 21 and gate 31 there may be interposed one or more source-to-drain path or paths of additional transistors. Generally speaking, zone 21 is or is part of the input path for operating transistor to be controlled by the signal applied to this pad 12. Zone 21 particularly as it extends underneath the bonding pad establishes a diffused resistance. In essence, this resistance extends between interface 17 and about point 28 as series input resistance for the gate circuit of operating transistor 30. However, this resistance does not significantly participate in the regular operation of that transistor 30. The resistance may be about 5 K ohms.

The gate of transistor 30 is thus controlled ultimately by the signal applied from external circuitry to the bonding pad 12 via zone path 21. The level of that input signal, unless attenuated, becomes fully effective between gate 31 and substrate. Gate 31 extends over an oxide layer increment thinned from the regular thickness of layer 20, preferably to a value below 2,000 A so as to control conduction through the channel between zones 32 and 33 of that particular, gate-controlled operating MOS transistor, at relatively low threshold voltage such as 3 volts or thereabouts.

Adjacent gate 31, diffusion zone 21 (or a diffusion zone connected to zone 21) establishes a zener diode 40. For this, the layer 20 is thinned in region 41 and a metallic layer 42 is disposed thereon, particularly above the surface-near part of the PN junction between diffused P zone 21 and substrate 10. That electrode 42 is grounded to reduce the avalanche breakdown level of the PN junction to a value well below the insulation breakdown of transistor 30. This zener diode 40, however, does not afford sufficient protection for transistor 30.

As can be seen more specifically from FIG. 2, P region or diffusion zone 21 extends underneath bonding pad 12, in a more or less straight line from which there jut out certain fingers 22, disposed in parallel to each other. These fingers 22 still pertain to zone 21 and are a part thereof. Fingers 22 more or less interdigitize with fingers 26 extending from and pertaining to another particular heavy doped region or diffusion zone, collectively denoted, with reference numeral 25 and having the same P type conductivity. The zone 25 has considerable width (in the plane of the chip) and extends away from underneath pad 12 and connects to ground.

Of course, these regions of particular conductivity 21, 22 and 25, 26 are near-surface regions of the semiconductor substrate and are separated from the bonding pad 12 by insulating layer 20. That separation is complete as far as region 25 is concerned, and most portions of regions 21 are likewise separated from the bonding pad except where the lug 13 makes ohmic contact with region 21. That contact area 17 is comparatively far, however, from region 25 and from any of its fingers 26. One can, therefore, see that underneath the bonding pad and separated therefrom by the thick insulating layer 20 there is a meandering channel 27 as between the interdigitized fingers 22 and 26.

The length of channel 27 is defined by the more or less constant spacing between zone portions 22 and zone portions 26. The distance between P-zone fingers 22 and 26 is selected to be as small as possible, to obtain a steep onset of current flow if the gate voltage exceeds threshold or turn-on level for this particular bonding pad transistor. A very large width of that channel is defined by the length of the meandering curve. The meander pattern can be extended as long as the dimensions of the bonding pad permits. In reality, the thus defined channel width of the bonding pad transistor is considerably larger than any linear dimension of the pad. The length of the meander path as defining the width of channel 27 in the plane of the chip, defines in the essence the cross-sectional area for current flow through channel 27 as between zones 22 and 26. The other dimension for that cross section is determined by the operational process of channel generation in this FET device.

This channel 27 is defined by an inversion layer between zone finger 22 and 26 which can be made subject to control by the voltage applied to the bonding pad. It is a specific feature of the invention that bonding pad 12 as a whole serves as a gate electrode for that particular field inversion channel, establishing therefore an MOS transistor with a rather thick insulating layer. Zone 21, 22 is the drain electrode and zone 25, 26 is the source electrode, and due to connection at area 17 this bonding pad transistor is operated in common drain-gate configuration.

The dimensions of this bonding pad transistor differ significantly from regular operating transistors. By way of example, a bonding pad has dimensions of about four-one thousand inch by four-one thousandth inch. The distance between fingers 22 and 26, defining the channel length, is about seven-ten of one-one thousandth inch. Each finger is about two-ten of one-one thousandth inch wide, and about 2.9 of one-one thousandth inch long so that the total width of meandering channel 27 is about twelve-one thousandth inches, which is considerably larger than any linear dimension of the bonding pad. Also, a regular minimum size transistor, such as 30, has channel dimensions in the plane of the substrate of about 0.3 by 0.3 one-thousandth inches. One can see, that the channel width of the bonding pad transistor (in the plane of the substrate) is about two orders of magnitude larger than the channel width of a regular transistor.

For reasons of diffused and distributed resistance in zone 21 that resistance is effective along the drain electrode proper of the bonding pad transistor so that the locally effective drain-to-source voltage in portions of the channel 27, remote from the input-near area 17, is actually below the gate voltage, but this does not significantly modify the common drain-gate configuration, because of the constant current characteristics for variable drain voltage of the device and the gate voltage is the same everywhere above channel 27.

This MOS bonding pad transistor differs from others in the circuit in that essentially the full thickness of insulating layer 20, or a reduced portion thereof, separates the bonding pad from the semiconductor substrate. The layer 20 is about 15,000 A to 18,000 A thick, and the bonding pad transistor has gate insulation of similar or comparable thickness, while gate insulation provided for other operating MOS transistors, such as 30, is established by an insulating layer portion being below 2,000 A thick. The thickness of the insulating layer 20 underneath pad 12 may be somewhat below the full, regular layer thickness but should be well in excess of the thickness of the insulating layer above a regular MOS transistor channel.

As a consequence, the threshold response for the transistor under the bonding pad is considerably higher than for regular transistors.

The thickness of oxide layer 20, either as a while or at least as far as its particular portion under any bonding pad 12 is concerned, is selected in the following manner. Normal signal input voltages applied to bonding pad 12 are insufficient to enhance channel conduction between zones 21, 22 and 25, 26, because the oxide layer separating channel 27 from the bonding pad is too thick to produce sufficient attraction for minority charge carriers to the inversion layer adjacent the oxide-semiconductor interface.

As stated, a voltage of about at least 3 volts is required to turn on a regular transistor such as 30. If that transistor has minimum size, the transition from nonconduction to saturation is rather steep. The turn-on voltage for the protective, bonding pad transistor of which bonding pad 12 is the gate, may be about 30 volts. Insulation breakthrough voltage for the regular transistor 30 may be the range of 80 volts or thereabouts. Normal operating signal voltage for the regular transistors may be about 20 volts, so that even for considerable variations in signal voltage, conduction of transistor 30 and others at saturation is assured.

It follows that layer 20 underneath bonding pad 12 is selected so that the bonding pad transistor channel 27 is rendered fully conductive for voltages well below an excessive voltage which may cause physical breakdown and destruction of the thin oxide layer of the channel of transistor 30. On the other hand, a regular 20 volt signal or thereabouts when applied by and from an external source to bonding pad 12 as normal operating voltage for the regular transistors in the IC, is insufficient to produce significant conduction enhancement in the channel 27 of the protecting, bonding pad transistor. Thus, this transistor does not actively participate in normal operations, but is turned on for excess input voltages.

An excess voltage such as a spike may appear and rise, say above 30 volts so that channel 27 between zones 21 and 25 becomes conductive. As stated, the length of the channel as defined by the distance between branches 22 and 26 should be as small as feasible, so that this protective transistor conducts likewise at saturation level for voltages only slightly above 30 volts. As this transistor conducts, a relatively low impedance path exists between ground, zone 25, zone fingers 26, channel 27, zone fingers 22, zone 21, lug 13, pad 12, and from there to the external signal source. The pad transistor is a constant current device, for this common drain-gate circuit and for gate voltages sufficient to turn the pad transistor on. The current is distributed along the width of channel 27 and that current additionally produces a voltage drop in direction of the arrow in zone 21. The signal voltage as applied to the remaining circuit at point 28 is thus attenuated by the divider ratio of the resistance of zone 21 and of the conductive pad transistor as connected with its source 26, 25 to ground.

The meandering pattern of the channel 27 provides a large width of channel 27 between the arms 22 and the arms 26, so that considerable current can flow off to grounded zone 25 and establishing a corresponding voltage drop particularly in zone 21 for maintaining the voltage potential at point 28 below safe limits. The zener diode 40 provides additional clamping; and augments the alternating operation of the pad transistors.

The channel impedance of channel 27 is comparable with the impedance of zone 21 for signal voltages causing the protective transistor to conduct. Thus, for signal voltages above the turn or threshold for the pad transistor, there is about a 2 : 1 voltage reduction (or a reduction within that range and order of magnitude) as between signal input and operating voltage at point 28.

It should be noted, that the input signal for pad 12 as transmitted through a wire bonded thereto, will be derived from a signal driver source external to the IC circuit and under conditions which may produce excess output voltages. As the pad transistor is conductive, the output circuit of that signal source is shunted to ground, possibly forcing additionally its internal operation to adapt to a reduced output voltage. The turning on of the bonding pad transistor produces an impedance change in the output circuit of this driver source, but less abrupt than in case of protection by zener diode alone. Still, there may result a shunt current, possibly being closed to a short circuit current which runs into and through the IC-chip. This, however, is permissible because of the unusual large cross section of the current path through the pad transistor. It is repeated here that the channel width of the bonding pad transistor is one or more orders of magnitude larger than the channel width of regular MOS operating transistors. Moreover, a large current through zone 21 enhances attenuating operation of the device by producing a correspondingly large voltage drop, lowering the effective signal voltage at point 28.

One can readily see that advantage has been taken of the considerable size of the bonding pad which as far as operating circuitry on an MOS chip is concerned, was previously regarded as "wasted space." That wasted space is being put to good use to establish the very wide channel through which excess current can flow off without damage to the IC. That bonding pad serves as gate as well as drain input for the protective transistor which permits bleeding off a large current, at rather low current density because the meandering channel 27 defines a current path of considerably cross section at small length between zones 22 and 26. Moreover, the resulting size of doped region 21 permits establishing a resistance that becomes significantly effective in the signal input path only when a shunt current is bled off through the bonding pad transistor. The relatively large area covered by zone 21 is instrumental here.

The voltage applied to gate 31 of transistor 30 is thus clamped to a voltage well below its insulation breakthrough volts. This protection should be provided in all input paths leading to a gate in an operating transistor extending above a thin layer of oxide material.

The invention is not limited to the embodiments described above but all changes and modifications thereof not constituting departures from the spirit and scope of the invention are intended to be covered by the following claims.

We claim:

1. An input device for an integrated circuit of the field effect MOS type, there being a bonding pad on the semiconductor body of the integrated circuit for connection of a wire through which a signal is applied to the circuit, the combination comprising:

an oxide layer increment underneath the bonding pad having thickness significantly above the oxide layer thickness for MOS transistors in the circuit;

a first zone establishing a drain electrode, extending underneath the bonding pad, insulated therefrom by the oxide layer, but making ohmic contact with the bonding pad in a limited area, the first zone having an extension beyond the bonding pad and relatively remote from the area of ohmic contact between the pad and the first zone;

a second zone establishing a source electrode and extending underneath the bonding pad at a small distance from the first zone, there being a field effect channel between the first and second zones the length of which is established by said distance, the width being at least comparable with the linear dimensions of the bonding pad and being considerably greater than said length;

the first and second zones having a configuration of interdigitized fingers, resulting in a meandering contour of the channel in its width dimension, that width being considerably larger than any linear dimension of the bonding pad; and an operating field effect transistor in the circuit, the field effect transistor having a gate, the extension of the first zone connecting directly or indirectly to the gate of the operating transistor, the second zone connecting to ground, the field effect transistor having particular voltage limits of safe operation, the field effect transistors having an oxide layer considerably less than the oxide layer increment below the first pad;

the bonding pad constituting the gate electrode as well as the drain electrode lead-in for a protective transistor covering the meandering contour completely, turned-on by signal voltages applied to the bonding pad in excess of normal signal voltages applied thereto for operating the gate voltage for the operating field effect transistor, the protective transistor, when conductive, limiting the gate voltage for the operating transistor;

the first zone underneath the bonding pad establishing a diffused particular resistance having value of comparable magnitude to the resistance of the channel when conductive, to serve as series resistance for input signal, a significant voltage drop across the resistance resulting only upon conduction and inversion enhancement of the channel;

the first zone having a portion, at the end opposite the gate of the field effect transistor, for receiving an input signal and for applying the input signal through the diffused resistance to the gate;

the diffused resistance operating in conjunction with the resistance of the channel to maintain the input voltage to the gate of the field effect transistor within safe limits when the protective transistor becomes conductive.

2. An input device as in claim 1, the oxide layer thicknesses in the protective and in the first transistor related by about 10 : 1.

3. The input device specified in claim 1 wherein the diffused resistance is formed on the pad for effective operation in the integrated circuit only when the protective transistor is conductive.

4. The input device specified in claim 3 wherein the second zone is grounded.

5. An input circuit as in claim 8, including a Zener diode interposed between the gate of the operating transistor and grounded substrate of the MOS circuit and connected to the first zone of the pad.

6. An input circuit as in claim 1, the bonding pad having quadrilateral configuration, the first zone extending along one side thereof establishing a diffused resistance having value comparable with the channel resistance for voltages above turn-on voltage of the protective transistor, below insulation breakdown voltage of the operating transistor, the first and second zones having interdigitized finger portions extending transverse to said side.

* * * * *